(12) United States Patent
Li et al.

(10) Patent No.: US 11,127,677 B2
(45) Date of Patent: Sep. 21, 2021

(54) RESISTOR STRUCTURE OF SERIES RESISTOR OF ESD DEVICE

(71) Applicant: Sichuan Energy Internet Research Institute, Tsinghua University, Sichuan (CN)

(72) Inventors: Yike Li, Sichuan (CN); Nie Li, Sichuan (CN)

(73) Assignee: SICHUAN ENERGY INTERNET RESEARCH INSTITUTE, TSINGHUA UNIVERSITY, Sichuan (CN)

( * ) Notice: Subject to any disclaimer, the term of this patent is extended or adjusted under 35 U.S.C. 154(b) by 0 days.

(21) Appl. No.: 16/469,135

(22) PCT Filed: Dec. 26, 2017

(86) PCT No.: PCT/CN2017/118588
§ 371 (c)(1),
(2) Date: Jun. 12, 2019

(87) PCT Pub. No.: WO2019/095507
PCT Pub. Date: May 23, 2019

(65) Prior Publication Data
US 2019/0333852 A1 Oct. 31, 2019

(30) Foreign Application Priority Data

Nov. 20, 2017 (CN) .......................... 201711155427.9

(51) Int. Cl.
*H01L 23/522* (2006.01)
*H01L 27/02* (2006.01)
*H01L 49/02* (2006.01)

(52) U.S. Cl.
CPC ...... *H01L 23/5228* (2013.01); *H01L 27/0262* (2013.01); *H01L 28/24* (2013.01)

(58) Field of Classification Search
CPC .............. H01L 23/5228; H01L 23/647; H01L 27/0288; H01L 27/0629; H01L 27/0738; H01L 27/0802; H01L 27/101
See application file for complete search history.

(56) References Cited

U.S. PATENT DOCUMENTS 7,919,832 B2   4/2011   Hsueh et al.
9,105,502 B2   8/2015   Zhang et al.
(Continued)

FOREIGN PATENT DOCUMENTS

CN   101221950 A   7/2008
CN   207425853 U   5/2018

*Primary Examiner* — Hsien Ming Lee
(74) *Attorney, Agent, or Firm* — Novick, Kim & Lee, PLLC; Allen Xue

(57) ABSTRACT

Provided is a resistor structure of a series resistor of an Electro-Static Discharge (ESD) device. A poly resistor is divided into N small parts, and each small part is connected to an upper-part metal layer through a respectively corresponding Contact and Via. The Contact and Via corresponding to each small part and the connected upper-part metal layer form an independent unit. A metal aluminum material is adopted for the Via and the upper-part metal layer. The metal aluminum material or an aluminum alloy material is adopted for the Contact. A heat capacity characteristic of metal aluminum is utilized, and an existing structure is ingeniously utilized, so that the resistor may be prevented from being damaged by heating caused by the same ESD current, and meanwhile, an overall size of a circuit where the ESD device is located is greatly reduced.

4 Claims, 3 Drawing Sheets

(56) References Cited

U.S. PATENT DOCUMENTS

| | | | |
|---|---|---|---|
| 9,293,452 B1* | 3/2016 | Zin | H01L 27/0266 |
| 9,355,971 B1* | 5/2016 | Mallikarjunaswamy | H01L 23/5256 |
| 2002/0033507 A1* | 3/2002 | Maria Verhaege | H01L 27/0266 257/360 |
| 2005/0266651 A1 | 12/2005 | Taylor et al. | |
| 2012/0205780 A1* | 8/2012 | Berglund | H01L 27/0761 257/577 |
| 2015/0001677 A1* | 1/2015 | Palumbo | H01L 29/405 257/536 |
| 2016/0155737 A1* | 6/2016 | Linewih | H01L 27/0629 361/56 |

\* cited by examiner

RESISTOR STRUCTURE OF SERIES RESISTOR OF ESD DEVICE

FIELD

The present invention relates to a resistor structure of a series resistor of an Electro-Static Discharge (ESD) device, and particularly to a resistor structure of an ESD series resistor in a semiconductor chip circuit.

BACKGROUND

In a semiconductor chip circuit, a poly (polycrystalline silicon) resistor of 10 ohms to 200 ohms is required to be connected in series before an ESD device sometimes to improve immunity of an ESD structure to noise outside a chip and make ESD unlikely to positively bias in an environment of grounding noise and power noise. Since the poly resistor is connected in series in an ESD path, an ampere-level current may pass through the poly resistor when ESD occurs. Therefore, for preventing the resistor from being damaged when ESD occurs, an area of the poly resistor is usually required to be designed to be quite large to absorb heat generated when ESD occurs to further prevent damage to the resistor.

When ESD occurs, a resistor is damaged mainly because of resistor overheating caused by excessively high instantaneous power. A poly resistor is relatively thin (approximately 0.2 μm-0.3 μm thick in a 0.18 process), and thus its heat capacity under the same area is limited. If its area is not large enough, energy generated when an ESD current flows through the poly resistor may rapidly heat it to exceed its melting point to further damage it. Therefore, a layout size of a resistor circuit is restricted to a great extent.

SUMMARY

The present invention is directed to provide a resistor structure of a series resistor of an ESD device, which may greatly reduce an overall size of a circuit where the ESD device is located and prevent the series resistor of the ESD device from being damaged when ESD occurs.

The present invention is implemented through the following technical solution. A resistor structure of a series resistor of an ESD device is provided. A poly resistor is divided into N small parts, and each small part is connected to an upper-part metal layer through a respectively corresponding Contact and Via. The Contact and Via corresponding to each small part and the connected upper-part metal layer form an independent unit. A metal aluminum material is adopted for the Via and the upper-part metal layer. The metal aluminum material or an aluminum alloy material is adopted for the Contact. N is a natural number greater than or equal to 2.

The poly resistor is circular, and for the same upper-part metal layer, metals on the same equipotential line are connected together and on the equipotential lines of the resistor at intervals.

The upper-part metal layer includes a first metal layer and a top metal layer, the Contact is connected to the Via through the first metal layer, and the Via is connected to the top metal layer.

A distance between edges of the Contacts of adjacent independent units is 4 μm-8 μm.

The distance between the edges of the Contacts is 6 μm.

A planar shape of the upper-part metal layer is a square or a rectangle.

Compared with the prior art, the present invention has the beneficial effects that a heat capacity characteristic of metal aluminum is utilized, and an existing structure is ingeniously utilized, so that the resistor is prevented from being damaged when ESD occurs, and meanwhile, an overall size of a circuit where the ESD device is located is greatly reduced.

DETAILED DESCRIPTION OF THE EMBODIMENTS

In order to make the purpose, technical solutions and advantages of the present invention clearer, the present invention will further be described below in combination with the accompanying drawings and embodiments in detail. It should be understood that the specific embodiments described here are only adopted to explain the present invention and not intended to limit the present invention.

Any characteristic disclosed in the description (including the abstract and the accompanying drawings) may be replaced with another equivalent or alternative characteristic with a similar purpose, unless otherwise stated. That is, each characteristic is merely an example in a series of equivalent or similar characteristics, unless otherwise stated.

Specific Embodiment 1

Figure 1:
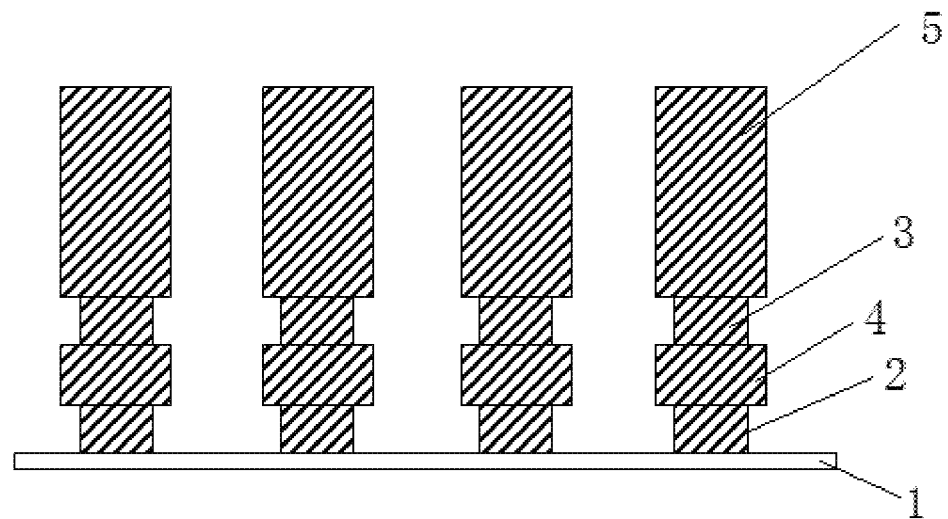
FIG. 1 is a sectional view of a process structure according to an embodiment of the present invention.

FIG. 1 illustrates a resistor structure of a series resistor of an ESD device. A poly resistor 1 is divided into N small parts, and each small part is connected to an upper-part metal layer through a respectively corresponding Contact 2 and Via 3. The Contact and Via corresponding to each small part and the connected upper-part metal layer form an independent unit. A metal aluminum material is adopted for the Via and the upper-part metal layer. The metal aluminum material or an aluminum alloy material is adopted for the Contact. N is a natural number greater than or equal to 2.

A heat capacity 880 J (kg·° C.) of metal aluminum is equivalent to 700 J (kg·° C.) of poly. Moreover, in a common process, a thickness of a metal may reach 3 μm, and a thickness of the poly is only ⅒ of that of the metal. Therefore, under the same area, the heat capacity of the metal is higher than that of the poly by one order of magnitude. By use of this fact, the poly and the metal may be combined to obtain a proper resistance and a proper heat capacity under a relatively small area.

In the present specific embodiment, the poly resistor is divided into many small parts by use of existing metal layers, and each small part carries a relatively thick metal, i.e., an existing aluminum metal layer, through the Contact and the Via. A heat capacity characteristic of the metal aluminum is utilized and an existing structure is ingeniously utilized, so that the resistor may be prevented from being damaged by heating under the same ESD current, and meanwhile, an overall size of a circuit where the ESD device may be greatly reduced.

Specific Embodiment 2

Figure 3:
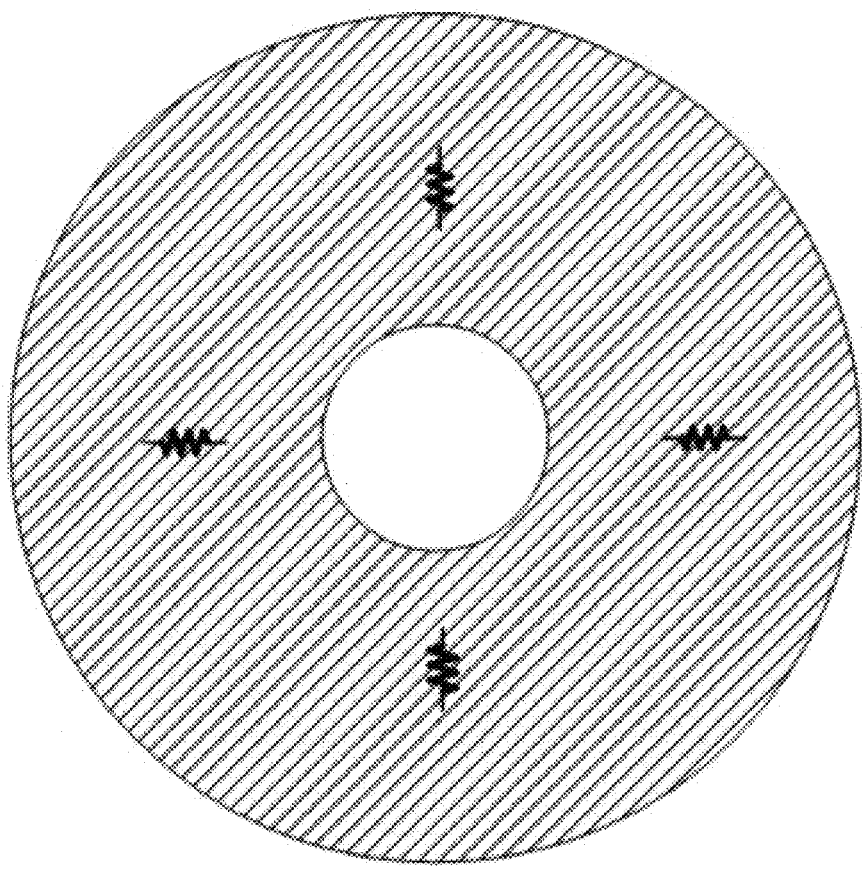
FIG. 3 is a circular poly resistor structure according to an embodiment of the present invention.
Figure 4:
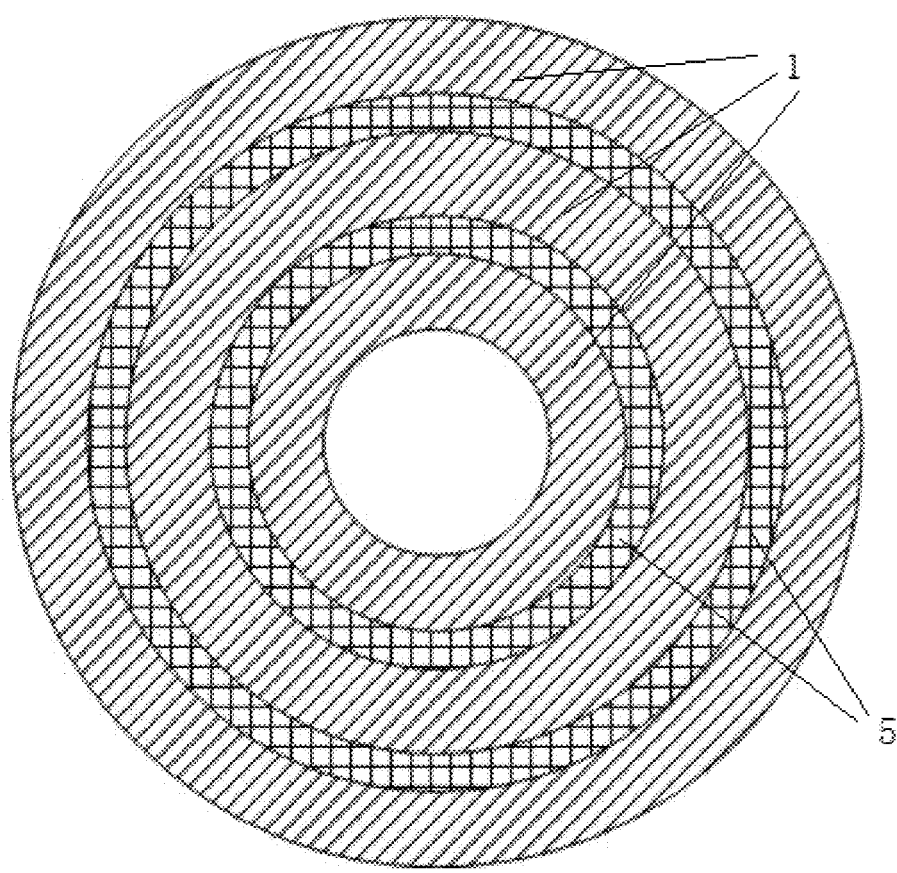
FIG. 4 is a comparison structure diagram of a top metal layer based on a poly resistor on the basis of the embodiment shown in FIG. 3.

On the basis of specific embodiment 1, as shown in FIG. 3 and FIG. 4, the poly resistor is circular, and for the same upper-part metal layer, metals on the same equipotential line are connected together and located on the equipotential lines of the resistor at intervals. In the present specific embodiment, as shown in FIG. 3, the poly resistor is circular. For maximally enlarging an available metal area, as shown in FIG. 4, the metals on the equipotential lines are connected together and the metals on different equipotential lines are located on the equipotential lines of the resistor at intervals, to form two or more circular upper-part metals.

Specific Embodiment 3

On the basis of specific embodiment 1 or 2, as shown in FIG. 1, in the present specific embodiment, the upper-part metal layer includes a first metal layer 4 and a top metal layer 5, the Contact is connected to the Via through the first metal layer, and the Via is connected to the top metal layer. Specifically, arrangement may be implemented according to a practical process condition, and is also applied when there are two or more layers of Vias or three or more metal layers.

Specific Embodiment 4

On the basis of one of specific embodiments 1 to 3, a distance between edges of the Contacts of adjacent independent units is 4 μm-8 μm.

By principle, metal arrangement density is as high as possible. However, the Contacts may occupy a certain area, and thus high metal density may bring a higher area requirement; low metal density may make it impossible to dissipate heat when poly between metals is heated. By calculation, in the present specific embodiment, the distance between the edges of the Contacts is 4 μm-8 μm.

Specific Embodiment 5

On the basis of specific embodiment 4, in the present specific embodiment, the distance between the edges of the Contacts is 6 μm.

Specific Embodiment 6

Figure 2:
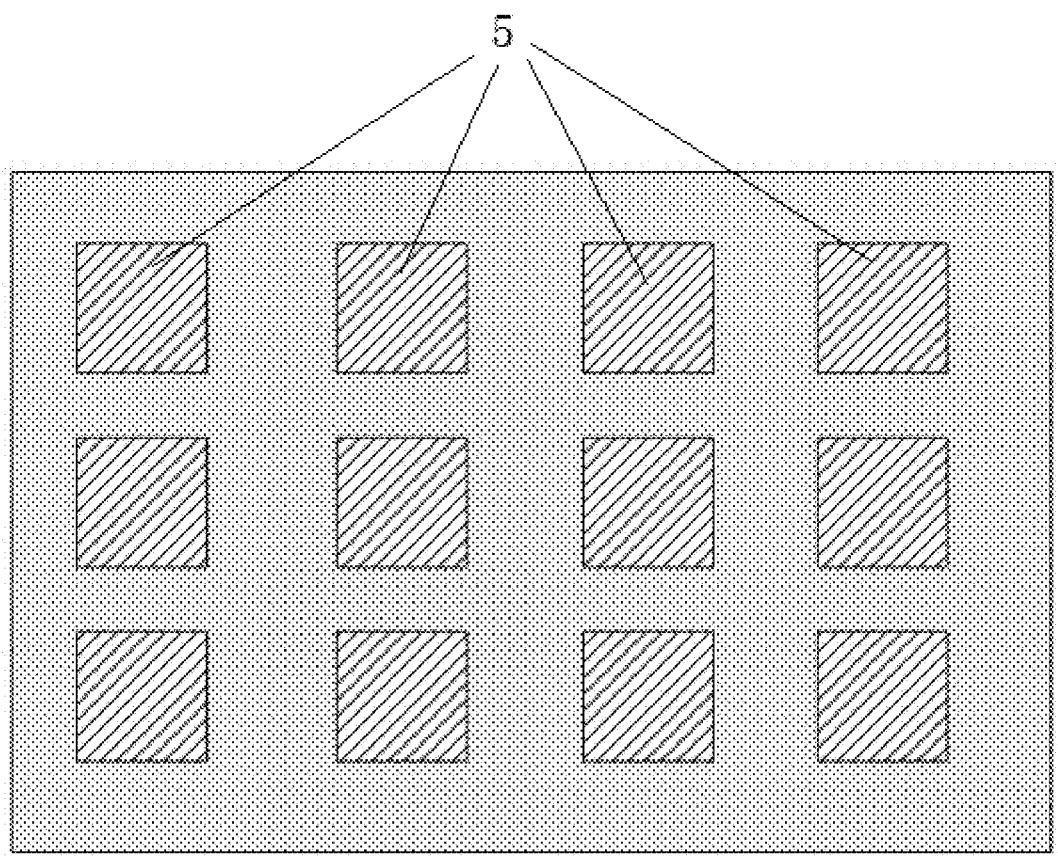
FIG. 2 is a plan view of a top-layer metal according to the embodiment shown in FIG. 1.

On the basis of specific embodiment 1 or one of specific embodiments 3 to 5, a planar shape of the upper-part metal layer is a square or a rectangle. In the embodiment shown in FIG. 2, the top-layer metal is a positive direction, and may also be arranged to be a square or a long strip.

The invention claimed is:

1. A resistor device, comprising:
   a poly resistor that is circular in shape;
   a plurality of stacks disposed on a surface of the poly resistor; and
   a plurality of circular top metal layers that are concentrically arranged,
   wherein each of the plurality of stacks comprises a contact disposed on the surface of the poly resistor and a via connected to one of the plurality of circular top metal layers,
   wherein the plurality of stacks comprises a first group of stacks and a second group of stacks,
   wherein the plurality of circular top metal layers comprises a first circular top metal layer and a second circular top metal layer,
   wherein the first group of stacks are disposed on a first equal potential line of the poly resistor, and each of the first group of stacks is electrically connected to the first circular top metal layer, and
   a second group of stacks are disposed on a second equal potential line on the poly resistor, and each of the second group of stacks is electrically connected to the second circular top metal layer,
   wherein each contact and the plurality of circular top metal layers are made of aluminum or aluminum alloy, and
   wherein the resistor device is configured to be connected with an Electrostatic Device (ESD).

2. The resistor device according to claim 1, wherein the plurality of stacks further comprises a third group of stacks and the plurality of circular top metal layers comprises a third circular top metal layer, wherein each of the third group of stacks is electrically connected to the third circular top metal layer.

3. The resistor device according to claim 1, wherein each of the plurality of stacks further comprises a first metal layer disposed between the via and the contact.

4. The resistor device according to claim 1, wherein a thickness of each circular top metal layer is larger than and is up to 10 times of a thickness of the poly resistor.

* * * * *